(12) United States Patent
Bernstein et al.

(10) Patent No.: US 8,792,602 B2
(45) Date of Patent: Jul. 29, 2014

(54) MIXED SIGNAL STOCHASTIC BELIEF PROPAGATION

(75) Inventors: Jeffrey Bernstein, Middleton, MA (US); Benjamin Vigoda, Winchester, MA (US); David Reynolds, Scarborough, ME (US); Alexander Alexeyev, Gorham, ME (US); William Bradley, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 589 days.

(21) Appl. No.: 13/032,520

(22) Filed: Feb. 22, 2011

(65) Prior Publication Data

US 2011/0255612 A1 Oct. 20, 2011

Related U.S. Application Data (60) Provisional application No. 61/306,866, filed on Feb. 22, 2010, provisional application No. 61/307,140, filed on Feb. 23, 2010, provisional application No. 61/328,484, filed on Apr. 27, 2010, provisional application No. 61/306,880, filed on Feb. 22, 2010.

(51) Int. Cl.
*H04L 7/00* (2006.01)
*H03M 13/11* (2006.01)
*H03M 13/00* (2006.01)

(52) U.S. Cl.
CPC ...... *H03M 13/6597* (2013.01); *H03M 13/1111* (2013.01)
USPC .......................................................... 375/368

(58) Field of Classification Search
USPC .......... 375/259, 260, 296, 340, 368; 370/335, 370/419
See application file for complete search history.

(56) References Cited

U.S. PATENT DOCUMENTS

| 5,959,871 A | 9/1999 | Pierzchala |
|---|---|---|
| 6,185,331 B1 | 2/2001 | Shi |
| 6,282,559 B1 | 8/2001 | Helfenstein |

(Continued)

FOREIGN PATENT DOCUMENTS

| EP | 0614157 | 10/1999 |
|---|---|---|
| WO | WO 91/05411 | 4/1991 |

(Continued)

OTHER PUBLICATIONS

D'Mello, Design Approaches to Field-Programmable Analog Integrated Circuits, Analog Integrated Circuits and Signal Processing, 17(1-2), 1998.

(Continued)

*Primary Examiner* — Michael J Moore, Jr
*Assistant Examiner* — Ajay Cattungal
(74) *Attorney, Agent, or Firm* — Occhiuti & Rohlicek LLP (57) ABSTRACT

A processor implements a network of functional nodes and communication paths between the nodes. The processor includes a plurality of circuit implementations of the functional nodes of the processor; and a plurality of signal paths implementing the communication paths linking the circuit implementations of the nodes. At least some of the signal paths are configured to pass signal values represented according to temporal patterns of signal levels on the signal paths. The processor also includes a plurality of circuit components for conversion between a signal value represented as a signal level (e.g., voltage or current level) and a signal value represented as a temporal pattern.

34 Claims, 7 Drawing Sheets

(56) References Cited

U.S. PATENT DOCUMENTS

| | | | |
|---|---|---|---|
| 6,584,486 | B1 | 6/2003 | Helfenstein |
| 6,744,299 | B2 | 6/2004 | Geysen |
| 6,762,624 | B2 | 7/2004 | Lai |
| 6,763,340 | B1 | 7/2004 | Burns |
| 7,071,846 | B2 | 7/2006 | Moerz |
| 7,292,069 | B2 | 11/2007 | Hannah |
| 7,418,468 | B2 | 8/2008 | Winstead |
| 7,623,582 | B2 * | 11/2009 | Kim et al. ............ 375/260 |
| 7,669,106 | B1 | 2/2010 | Farjadrad |
| 7,769,798 | B2 | 8/2010 | Banihashemi |
| 8,069,390 | B2 * | 11/2011 | Lin ............ 714/758 |
| 2005/0165879 | A1 | 7/2005 | Nikitin |
| 2005/0240647 | A1 | 10/2005 | Banihashemi |
| 2006/0026224 | A1 | 2/2006 | Merkli |
| 2006/0107192 | A1 | 5/2006 | Mantha et al. |
| 2006/0206778 | A1 | 9/2006 | Wehn et al. |
| 2007/0011502 | A1 | 1/2007 | Lin et al. |
| 2007/0033242 | A1 | 2/2007 | Wilber |
| 2007/0071114 | A1 * | 3/2007 | Sanderford et al. ....... 375/259 |
| 2007/0113147 | A1 * | 5/2007 | Hong et al. ........... 714/758 |
| 2008/0028274 | A1 * | 1/2008 | Lin ............ 714/752 |
| 2008/0065573 | A1 | 3/2008 | Macready |
| 2008/0077839 | A1 | 3/2008 | Gross |
| 2008/0174460 | A1 | 7/2008 | Vigoda et al. |
| 2008/0294970 | A1 | 11/2008 | Gross |
| 2009/0217130 | A1 * | 8/2009 | Myung et al. ........... 714/752 |
| 2009/0228238 | A1 | 9/2009 | Mansinghka |
| 2009/0259709 | A1 | 10/2009 | Nikitin |
| 2009/0267821 | A1 * | 10/2009 | Chmelar et al. ........ 341/159 |
| 2010/0033228 | A1 | 2/2010 | Gershenfeld |
| 2010/0205506 | A1 * | 8/2010 | Hara ............ 714/755 |
| 2010/0301899 | A1 | 12/2010 | Vigoda |
| 2010/0306150 | A1 | 12/2010 | Reynolds |
| 2010/0306164 | A1 | 12/2010 | Reynolds |
| 2011/0007722 | A1 * | 1/2011 | Wu et al. ........... 370/338 |
| 2011/0200124 | A1 * | 8/2011 | Nara ............ 375/259 |
| 2012/0140231 | A1 * | 6/2012 | Knox et al. ......... 356/442 |
| 2012/0207229 | A1 * | 8/2012 | Ananthaswamy ....... 375/259 |

FOREIGN PATENT DOCUMENTS

| | | |
|---|---|---|
| WO | WO2009/137227 | 3/2010 |
| WO | WO2010/259256 | 3/2010 |
| WO | WO2010/101941 | 9/2010 |
| WO | WO2010/101944 | 9/2010 |

OTHER PUBLICATIONS

Eguchi, Simple Design of a Discrete-Time Chaos Circuit Realizing a Tent Map, IEICE Trans. Electron. vol. E83-C(5), May 2000.
Gross, Stochastic Implementation of LDPC Decoders, Signals, Systems and Thirty-Ninth Asilomar Conference 2005.
Hagenauer, A Circuit-Based Interpretation of Analog MAP Decoding with Binary Trellises, Proc. 3rd ITG Conference Source and Channel Coding, Munchen, 2000.
Hagenauer, Analog Decoders and Receivers for High Speed Applications, Proc. of 2002 Int. Zurich Sem. on Broadband Comm, 2002.
Haley, An Analog LDPC Codec Core, Proc. Int. Symp. on Turbo Codes and Related Topics, 2003.
Loeliger, Decoding in Analog VLSI, IEEE Communications Magazine, pp. 99-101, Apr. 1999.
Loeliger, Probability Propagation and Decoding in Analog VLSI, IEEE Transactions on Information Theory, 2001.
Loeliger, Analog Decoding and Beyond, ITW2001, 2pgs., Sep. 2001.
Luckenbill, Building Bayesian Networks with Analog Subthreshold CMOS Circuits, Yale University, 2002.
Lustenberger, On the Design of Analog VLSI Iterative Decoders, ETH No. 13879, Zurich, 2000.
Mansinghka, Stochastic Digital Circuits for Probabilistic Inference, MIT, Cambridge, Nov. 2008.
Mansinghka, Natively Probabilistic Computation, MIT Ph.D. 2009.
Nguyen, A 0.8V CMOS Analog Decoder for an (8,4,4) Extended Hamming Code, Proceedings of the 2004 International Symposium on Circuits and Systems, 2004.
Rapley, Stochastic Iterative Decoding on Factor Graphs, Proc. 3rd Int. Symp. on Turbo Codes and Related Topics, pp. 507-510, 2003.
Schaefer, Analog Rotating Ring Decoder for an LDPC Convolutional Code, ITW2003, Paris, France, Mar. 31-Apr. 4, 2003.
Sequin, Analogue 16-QAM demodulator, Electronics Letters vol. 40, No. 18, 2004.
Stan, Analog Turbo Decoder Implemented in SiGe BiCMOS Technology, U. of Virginia, Dec. 15, 2002.
Tehrani, Stochastic Decoding of LDPC Codes, IEEE Communications Letters 10(10) Oct. 2006.
Vigoda, A Nonlinear Dynamic System for Spread Spectrum Code Acquisition, MIT M.S. Thesis, Aug. 1999.
Vigoda, Analog Logic: Continuous-Time Analog Circuit for Statistical Signal Processing, MIT Ph.D. Thesis, Sep. 2003.
Vigoda, Synchronization of Pseudorandom Signals by Forward-Only Message Passing With Application to Electronic Circuits, IEEE Trans. Info. Theory, Aug. 2006.
Winstead, Analog MAP Decoder for (8,4) Hamming Code in Subthreshold CMOS, ISIT 2001.
Winstead, Analog Iterative Error Control Decoders, U. Alberta, Ph.D. Thesis, 2005.
Winstead, Analog Soft Decoding for Multi-Level Memories, Proc. IEEE Int. Symp. On Multiple-Value Logic (ISMVL'05).
Winstead, Stochastic Iterative Decoders, International Symposium on Information Theory 2005.
International Search Report for PCT/US2011/025705, May 13, 2011.

\* cited by examiner

MIXED SIGNAL STOCHASTIC BELIEF PROPAGATION

CROSS-REFERENCE TO RELATED APPLICATIONS

This application claims the benefit of the following U.S. Provisional Applications, the contents of which are incorporated herein by reference:

Ser. No. 61/306,866, titled "MIXED ANALOG/DIGITAL PROCESSING IN A STOCHASTIC," filed on Feb. 22, 2010;

Ser. No. 61/307,140, titled "MIXED ANALOG/DIGITAL PROCESSING IN A STOCHASTIC," filed on Feb. 23, 2010;

Ser. No. 61/328,484, titled "STOCHASTIC LOGIC GATE," filed on Apr. 27, 2010; and Ser. No. 61/306,880, titled "SELECTIVE DELAY OF DATA RECEIPT IN STOCHASTIC COMPUTATION," filed on Feb. 22, 2010.

This application is also related to, but does not claim the benefit of the filing dates of, the following applications, which is incorporated herein by reference:

PCT Serial No. PCT/US10/25956, titled "BELIEF PROPAGATION PROCESSOR," filed on Mar. 2, 2010, published as WO2010/101944 on Sep. 10, 2010; and PCT Serial No. PCT/US11/20794, titled "BELIEF PROPAGATION PROCESSOR," filed on Jan. 11, 2011.

STATEMENT AS TO FEDERALLY SPONSORED RESEARCH

This invention was made with government support under awarded by FA8750-07-C-0231 awarded by the Defense Advanced Research Projects Agency (DARPA). The government has certain rights in the invention.

BACKGROUND

This invention relates to a mixed signal (e.g., analog level and stochastic temporal pattern) implementation of a belief propagation processor.

Soft logic processing with analog values has a number of applications, including in decoding of Low Density Parity Check (LDPC) codes. A number of algorithms have been proposed for either processing digital or analog representations of values, including the Sum-Product (SP) algorithm, which is sometimes referred to as a Belief Propagation Algorithm, and the Min-Sum (MS) algorithm (also referred to as Max-Sum or Max-Product), which can be regarded as an approximation of the SP algorithm. A description of such algorithms may be found in H. Wymeersch, *Iterative Receiver Design*, Cambridge University Press, Cambridge, 2007.

Implementations of the Sum-Product (SP) algorithm for error correction decoding generally involve two kinds of soft-gates: Equals and XOR. The connectivity between the Soft equals and Soft XOR is based on the check-matrix associated with the specific error correcting code.

In some implementations of the Sum-Product algorithm, messages are passed between Soft Equals and Soft XOR gates as stochastic signals that randomly vary between a set of signal values (e.g., between a set of two possible values, such as 0 and 1 volt) such that the average of the signal over time represents the message value. An example of such implementation is described in C. Winstead et al., "Stochastic Iterative Decoders," *Cornell Computing Research Repository* (*CoRR*) (2005), http://arxiv.org/abs/cs/0501090. Such stochastic implementations face challenged including correlation of stochastic signals and/or complexity or resource requirements of circuitry for addressing such possible correlation.

SUMMARY

In one aspect, in general, a processor implements a network of functional nodes and communication paths between the nodes. The processor includes a plurality of circuit implementations of the functional nodes of the processor; and a plurality of signal paths implementing the communication paths linking the circuit implementations of the nodes. At least some of the signal paths are configured to pass signal values represented according to temporal patterns of signal levels (e.g., voltage or current) on the signal paths. At least some of the circuit implementations of the functional nodes include circuitry for combining temporal patterns of a plurality of signals to form a temporal pattern on a combined signal. The processor also includes a plurality of circuit components for conversion between (i.e., either from or to or both) a signal value represented as a signal voltage or current level and a signal value represented as a temporal pattern.

Examples of the processor can have one or more of the following features.

The signal values represented as signal levels are represented as voltage or current levels.

The signal values represented as temporal patterns are represented by time averages of varying signal levels.

The processor implements a belief propagation algorithm. For instance, the processor implements a Sum-Product algorithm.

The network represents a factor graph. In some examples, the plurality of circuit implementations of the functional nodes a plurality of circuit implementations of variable nodes and a plurality of circuit implementations of factor nodes.

The processor is configured to perform a decoding operation. The variable nodes correspond to inputs to the decoding, and the factor nodes correspond to constraints on the inputs. In some examples, the decoding operation is a decoding of a Low Density Parity Check (LDPC) code.

At least some of the circuit implementations of the functional nodes include circuitry for combining signal levels of a plurality of signals to form a signal level on a combined signal.

The functional nodes that include circuitry for combining signal levels further include at least some of the circuit components for conversion between a signal value represented as a signal voltage or current level and a signal value represented as a temporal pattern. Said circuit component for conversion are coupled to the circuitry for combining the signal levels.

The plurality of circuit components for conversion between a signal value represented as a signal voltage or current level and a signal value represented as a temporal pattern include components for conversion from a signal level to a random temporal pattern. The random pattern may be a pseudo-random pattern.

The random temporal pattern comprises a temporal pattern of transitions between a set of signal levels, and the signal value is represented using a fraction of time at one or more levels of the set of signal levels.

The random temporal pattern comprises a temporal pattern of transitions between two signal levels and the signal value is represented using a fraction of time at one of the signal levels.

The signal value is represented as a monotonic function of the fraction of time at one of the levels. In some examples, the signal value is represented as a linear function of the fraction of time at one of the levels. In some examples, the signal value is represented as a compressive function (e.g., logarithmic or sigmoid function) of the fraction of time at one of the levels.

At least one component for conversion from a signal level to a random temporal pattern includes a random signal generator with output signal statistics independent of the signal level, and a circuit for combining the signal level and an output of the random signal generator to form the random temporal pattern according to the signal level.

The circuitry for combining the random signal and the signal level comprises a comparator to compare the signal level and a time-varying level of the random signal. In some examples, the random signal generator has a uniform output level distribution.

The plurality of circuit components for conversion between a signal value represented as a signal voltage or current level and a signal value represented as a temporal pattern include components for conversion from a temporal pattern to a signal level.

At least one component for conversion from a temporal pattern to a signal level includes an averaging (e.g., integrating, scaled integrating, "leaky" integration) circuit for accepting the signal with the temporal pattern and being responsive to a fraction of time the signal with the temporal pattern has a first signal level of a set of signal levels uses to form the temporal pattern.

The averaging circuit comprises a fixed interval averaging circuit that is responsive to a fraction of time within the fixed interval that the signal has the first signal level.

The averaging circuit comprises at least one of a decaying averaging circuit and a moving average circuit that is responsive to the fraction of time the signal has the first signal level.

The signal level is a monotonic function of the fraction of time the signal with the random pattern has the first signal level. In some examples, the signal value is a linear function of the fraction of time at the first level. In some examples, the signal value is a compressive function of the fraction of time at the first level.

The plurality of circuit implementations of function nodes include a plurality implementations of Soft XOR nodes.

Each of the implementations of a Soft XOR node comprising a logical XOR gate configured to accept a plurality of signals with values represented as temporal patterns, and to produce a signal with a temporal pattern as the output of the logical XOR gate.

The plurality of circuit implementations of function nodes include a plurality implementations of Soft Equals nodes.

Each of the implementation of a Soft Equals node comprises a logic circuitry configured to accept a plurality of signals with values represented as temporal patterns, and to produce a signal with a temporal pattern as the output of the logic circuitry. The implementation further comprises a first circuit component of the plurality of circuit components for conversion between a signal value represented as a signal voltage or current level and a signal value represented as a temporal pattern circuitry. Said circuit component is coupled to the output of the logic circuitry and forms a first signal with a value represented as a signal voltage or current level. A second circuit component of said plurality of circuit components for conversion of the first signal to form a second signal with a value represented as a temporal pattern. In some examples, the logic circuitry comprises a flip-flop, for instance a J-K flip flop.

Each of the implementation of a Soft Equals node comprises one circuit component of the plurality of circuit components for conversion between a signal value represented as a signal voltage or current level and a signal value represented as a temporal pattern circuitry coupled to each input for converting a signal value represented as a temporal pattern to a signal value represented as a signal level. The implementation further comprises functional circuitry for combining the signal levels output from the circuit components, and a further circuit component of the plurality of circuit components for conversion between a signal value represented as a signal voltage or current level and a signal value represented as a temporal pattern circuitry coupled to the output of the functional circuitry for converting from a signal value represented as a signal level to a signal value represented as a temporal pattern.

The processor further comprises a plurality of storage cells, each storage cell for writing and for reading a signal level.

The processor further comprises a delay circuit on each of at least some of said signal paths links. Each delay module is configured or configurable to delay a signal represented as a time pattern traversing said signal path by an assigned delay. In some examples, the delay circuit is combined with a circuit component for converting between a signal level and a time pattern representation of a signals value on the signal path.

Each storage cell is coupled or couplable to a circuit component of the plurality of circuit components for conversion between a signal value represented as a signal voltage or current level and a signal value represented as a temporal pattern circuitry for at least one of receiving a value represented as a temporal pattern and providing a value represented as a temporal pattern.

In another aspect, in general, software, which may be stored on a tangible computer readable medium, comprises instructions for forming any example of a processor as described above. For example, the software may include a Hardware Description Language (HDL) representation of the processor.

In another aspect, in general, an apparatus for stochastic belief propagation includes a plurality of node circuits, each node circuit being connected to at least one other node circuit by an edge, each of the node circuits being configured to output an M-ary stream of random M-ary variables having a selected probability distribution; and a plurality of re-randomizing circuits, each of the re-randomizing circuits being in data communication with at least one of the node circuits for receiving the M-ary stream, and having an analog stage that outputs an electrical quantity that is an analog function of the selected probability distribution. In one particular embodiment, M=2.

Additional embodiments include those in which the re-randomizing circuit includes an integrator, and those in which the re-randomizing circuit includes an accumulator for accumulating a quantity when the M-ary variable is in a first state, and for maintaining accumulating quantity when the M-ary variable is in a second state. Exemplary accumulators include a capacitor for accumulating charge and a CCD for accumulating photons.

In some other embodiments, the re-randomizing circuit is configured to accumulate the quantity for a period that spans more than one M-ary variable. Among these are those in which the re-randomizing circuit includes first and second accumulators, and switches for causing the first accumulator to accumulate the quantity during the first interval and to cause at least a portion of the quantity to be transferred to the second accumulator after the interval.

In another aspect, in general, a circuit for logical processing is made up of a number of gates. One or more of the gates each has multiple signal inputs, each accepting an M-ary time-varying signal ($x_i(t)$). The gate also has multiple integrator sections, each coupled to one of the signal inputs and providing an output ($\mu_i$) characterizing a sample distribution of signal input values on that input. A signal combination section of the gate is used for combining the quantities characterizing the signal inputs and providing an output (v) representing a combination of the sample distributions of the signal values forming a desired characteristic of a distribution of output signal values. A resampler section of the gate uses the output of the signal combination section to form an M-ary time varying output signal (y(t)) having the desired distribution of signal values. In some examples, the gate implements a stochastic equals operator.

Aspects may include one or more of the following features.

The gate further comprises a memory element for storing the output ($\mu_i$) of each integrator section.

The gate further comprises a memory element for storing the output (v) of the signal combination section.

The integrator section implements a function equivalent to $$\mu_i = \frac{1}{T}\sum_{t=1}^{T} x_i(t).$$

The integrator section implements a function equivalent to $$\mu_i(t) = \frac{1}{T}x_i(t) + \left(1 - \frac{1}{T}\right)\mu_i(t-1) = \frac{1}{T}\sum_{k=0}^{} \left(1 - \frac{1}{T}\right)^k x_i(t-k).$$

The signal combination section implements a function equivalent to $$v=(\pi_i\mu_i)(\pi_i\mu_i+\pi_i(1-\mu_i))^{-1}.$$

One or more aspects address a number of technical problems in implementing stochastic, or partially stochastic, belief propagation systems.

Purely digital (e.g., using digital logic) implementations of stochastic belief propagation can require significant resources (e.g., circuit area, power, etc.) to implement resampling functions to remove correlation between stochastic signals. Analog averaging and resampling can require fewer such resources.

Digital implementation of resampling require significant digital state (e.g., counters, shift registers, etc.). Even if functional circuits are time shared, at least some state must be maintained for the resampling nodes, thereby limiting the amount of savings that can be achieved by time sharing. Use of analog representations of certain signals can provide an efficient means of preserving state without requiring significant resources to maintain state.

Certain functions, such as Soft XOR may be more efficient to implement in stochastic form, while other functions, such as Soft Equals may be more efficiently implemented in an analog form. Therefore, a mixed analog and stochastic (digital) implementation may achieve higher efficiency than a purely analog or purely stochastic implementation.

In certain implementations, signal paths that use temporal patterns of transitions between two or a limited set of signal values may provide advantages over use of a voltage or signal level. For example, such signal paths may be less affected by signal noise.

Other features and advantages of the invention are apparent from the following description, and from the claims.

DESCRIPTION

Figure 1:
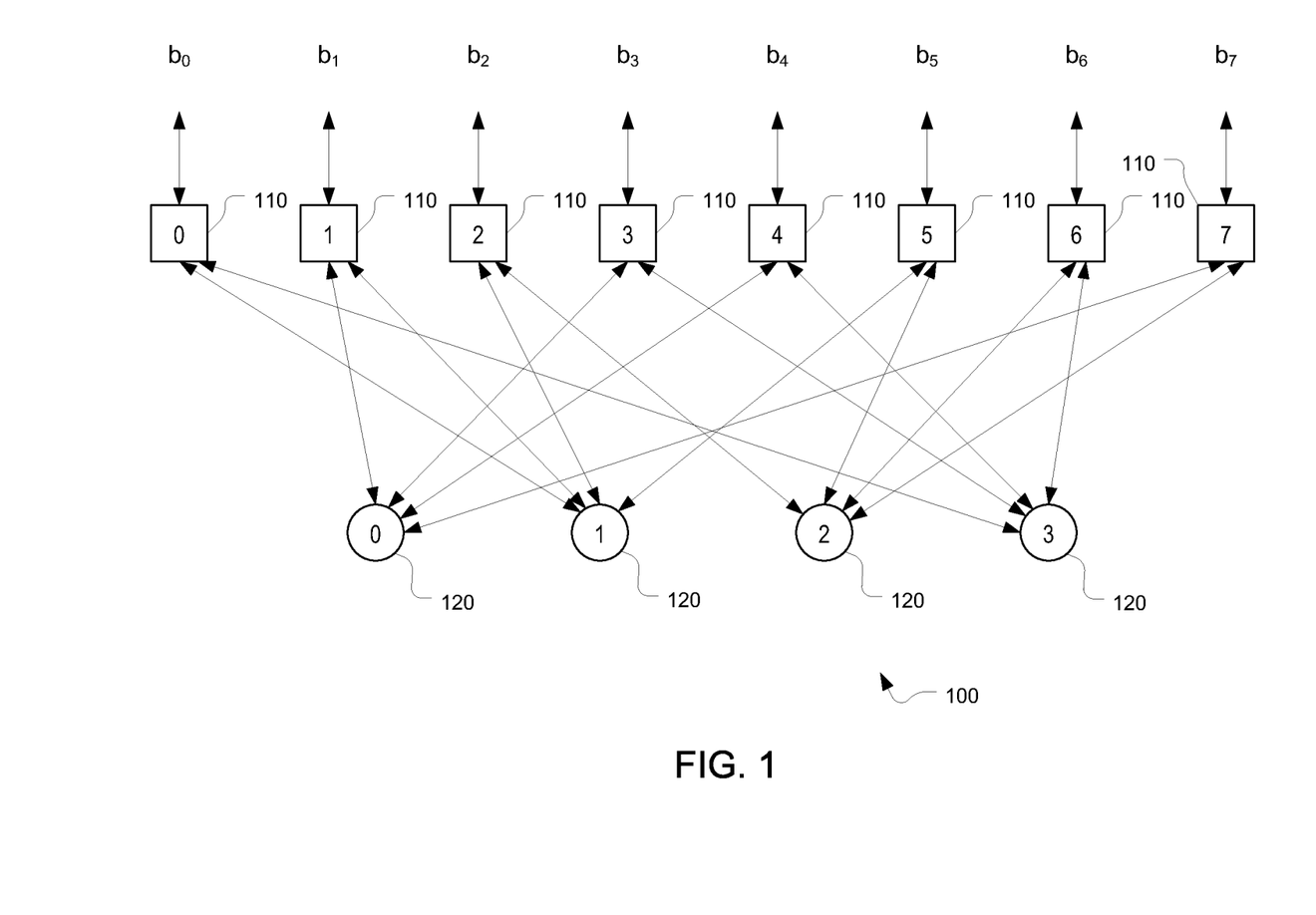
FIG. 1 is an example factor graph for a length 8 LDPC code.
Figure 2A:
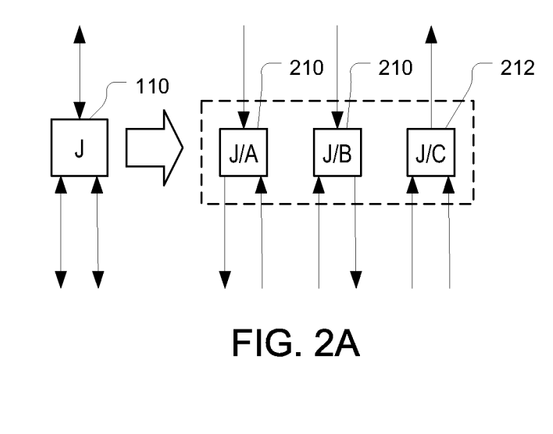
FIG. 2A is a diagram that illustrates transformation of a variable node with bidirectional links to a set of variable nodes with directed links.
Figure 2B:
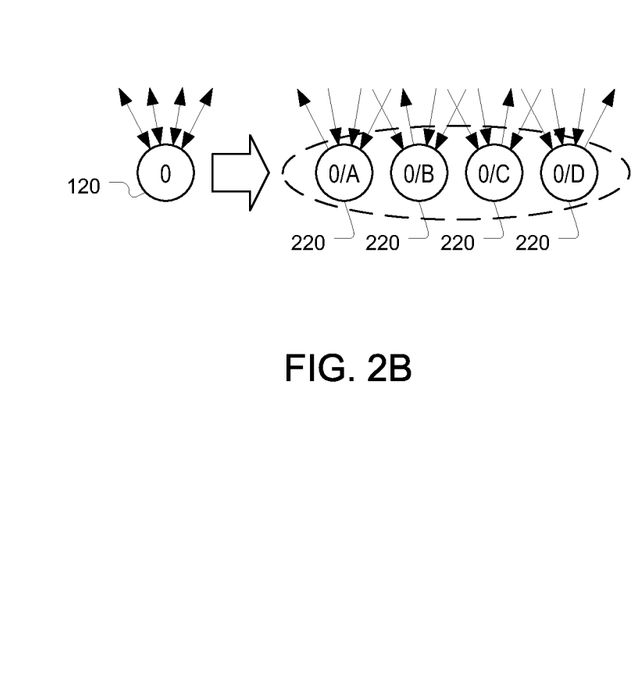
FIG. 2B is a diagram that illustrates a similar transformation for a constraint node.

Referring to FIGS. 1 and 2, an example of an analog-based implementation of a belief propagation processor, which implements a decoder for a Low Density Parity Check (LDPC) code is based on a factor graph 100 in which one variable node 110 is associated with each different input bit ($b_j$), and one check (constraint) node 120 is associated with each parity constraint. Approaches to analog implementation of such a process are described in co-pending patent publication WO2010/101944, titled "BELIEF PROPAGATION PROCESSOR," as well as in PCT Serial No. PCT/US11/20794, which are incorporated by references. The description below provides further embodiments of such a processor in which at least some signal are not necessarily encoded by the analog amplitude of the signals, and rely at least in part of a time pattern of the signals. For reference, the description corresponding to FIGS. 1-2, which correspond to the same numbered figures in the above-referenced co-pending application, are provided below.

In FIG. 1, an example with eight input bits with four checks (constraints) on the input bits is shown. The code can be represented in matrix form in which each column is associated with a different input bit, and each row is associated with a different check or constraint. An (i, j) entry is 1 if the $j^{th}$ input is used in the $i^{th}$ constraint and 0 otherwise. In the LDPC example, the constraint is that the XOR of the inputs for a constraint is 0. This example length 8 LPDC code can be represented according to the following check matrix (note that the rows are dependent modulo 2 in this illustrative example, which is not necessarily true in general):

$$\begin{bmatrix} 0 & 1 & 0 & 1 & 1 & 0 & 0 & 1 \\ 1 & 1 & 1 & 0 & 0 & 1 & 0 & 0 \\ 0 & 0 & 1 & 0 & 0 & 1 & 1 & 1 \\ 1 & 0 & 0 & 1 & 1 & 0 & 1 & 0 \end{bmatrix}$$

In FIG. 1, each edge is bidirectional representing a signal path in each direction. Referring to FIGS. 2A-B, an equivalent directed (unidirectional) graph can be formed by replacing each n-edge node with n separate nodes, each of the n nodes having n−1 inputs and one output, and forming unidirectional edges between the nodes to achieve the connectivity of the original graph. Referring to FIG. 2A, for instance, each 3-edge variable node 110 can be replaced with three 2-input/1-output variable nodes 210, 212, each of which implements a Soft Equals function. Referring to FIG. 2B, each 4-edge check node 120 can be replaced with four 3-input/1-output check nodes 220, which is implements a Soft XOR function.

One approach to analog implementation of a decoder corresponding to the factor graph shown in FIG. 1 is to implement a circuit element for each node of the equivalent unidirectional graph. In embodiments described in co-pending patent publication WO2010/101944, the signals passing between circuit elements are represented as analog voltages or current. In a number of these embodiments, the voltage or current of a signal is logarithmically related to the message value for the SP algorithm.

In FIG. 2A, each bidirectional Soft Equals node 110 with n inputs is implemented as n directional Soft Equals nodes 210. Similarly, as shown in FIG. 2B, each Soft XOR node 120 with n inputs is implemented with n directional Soft XOR nodes 220. Each directional Soft Equal node with inputs $x_1, \ldots, x_{n-1}$ and output $y_n$ accepts messages representing $p(x_i=1)$ and outputs a message $p(y_n=1)$ such that $$p(y_n = 1) = \prod_{i=1}^{n-1} p(x_i = 1) \bigg/ \prod_{i=1}^{n-1} p(x_i = 0) + \prod_{i=1}^{n-1} p(x_i = 1),$$

$p(x_i=0)=1-p(x_i=1)$.

Figure 3:
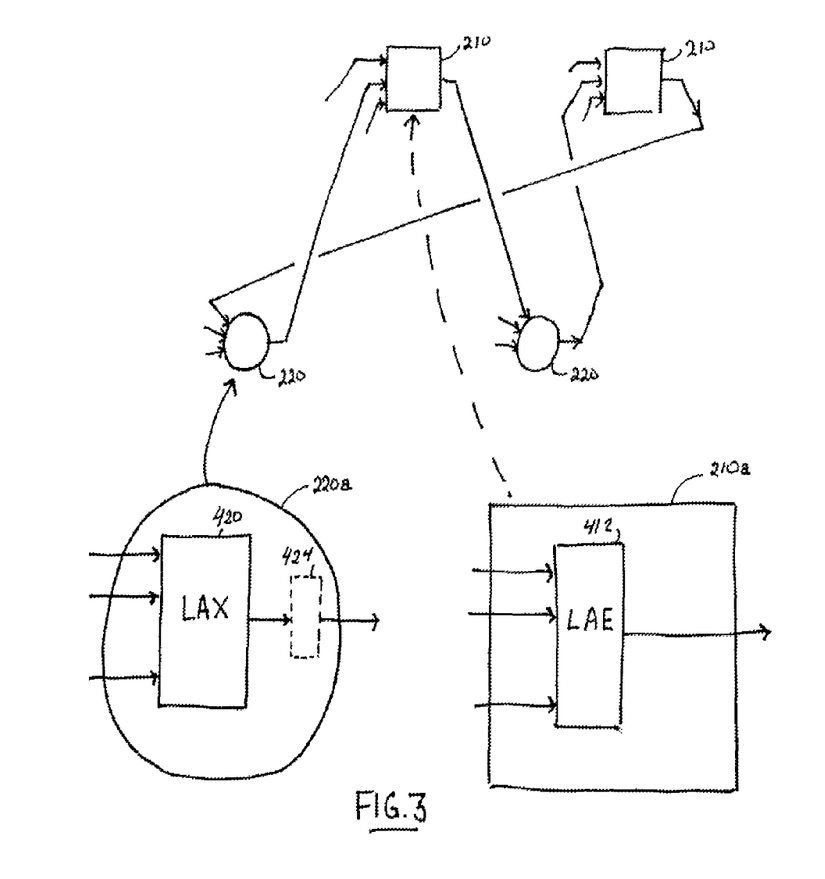
FIG. 3 shows a portion of a factor graph implementation, and analog circuit processing elements.

Each directional Soft XOR node 220 with inputs $y_1, \ldots, y_{m-1}$ and output $x_n$ accepts messages representing $p(y_i=0)$ and outputs a message representing $p(x_n=0)$ such that $p(x_m=1)=p(XOR(y_1, \ldots, y_{m-1})=1)$ which in the case of a three input node is equivalent to $p(x_m=1)=p(y_1=1)p(y_2=0)+p(y_1=0)p(y_2=1)$ Referring to FIG. 3, a portion of a factor graph is shown with interconnection of directional Soft Equals nodes 210 and Soft XOR nodes 220. In implementations described in the patent publication WO2010/101944, log domain analog Soft XOR circuits 220a are used to implement Soft XOR nodes. In some implementations of the log domain Soft XOR 220a, circuitry (LAX) 420 accepts voltage (e.g., differential voltage on a pair of signal lines) representations of a log likelihood ratio representing the message (e.g., $\log(p(x=1)/p(x=0))$), and provides a corresponding voltage based log-likelihood representation as output. In some implementations, the output of the LAX circuitry 420 may be stored between discrete iterations in an analog memory cell 424, while in other implementations, a continuous relaxation approach, or a mixed combination of discrete iterations in which partial relation is enabled in each iteration, may be used. Similarly, the Soft Equals node 210 is implemented using a log domain analog Soft Equals (LAE) circuit 412, which accepts log analog inputs and provides log analog outputs suitable for input to the LAX circuitry 420. Patent publication WO2010/101944 and PCT Serial No. PCT/US11/20794 also describe implementations in which instances of LAX and LAE circuitry are time shared (i.e., temporally reused) in different cycles of an iteration, using a complete set of analog memory cells 424 to maintain state between cycles.

Other embodiments replace the signal representation on one or more of the signal paths between the circuit implementations of the Soft Equals 210 and Soft XOR 220 nodes from use of solely signal level (e.g., voltage, current, charge, or other physical signal characteristic that can represent a continuous or finely quantized range) with a "stochastic" representation that use the temporal pattern of transitions between fixed levels to represent a continuous (or finely quantized) range of values. A number of embodiments described below make use of the average value of signals that randomly (e.g., pseudo randomly) alternate between to voltage (or alternatively current) levels. Without loss of generality, in some embodiments, one signal level is referred to below as "1" or "true", and another as "0" or "false", with the understanding that such levels may correspond to specific pairs of levels (e.g., 0 volts and 5 volts) or, for example, using level ranges as is customary in digital logic circuitry.

Figure 4:
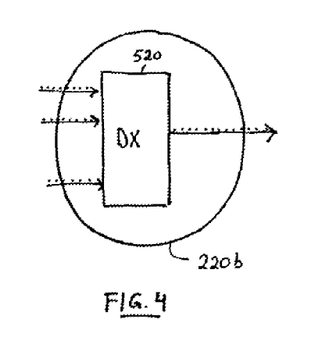
FIG. 4 is a stochastic implementation of a Soft XOR node.
Figure 6:
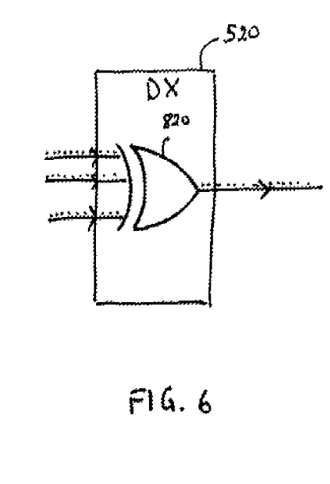
FIG. 6 is a logic circuit implementations of a stochastic Soft XOR node.

Referring to FIG. 4, in some embodiments, Soft XOR nodes 220 are implemented using an stochastic domain Soft XOR circuit 220b. The circuit includes a stochastic XOR circuit (DX) 520, which accepts the stochastic representations as input and provides a stochastic representation as output. In the figures, dotted signal lines are generally used to indicate signal lines used to pass stochastic signals. Referring to FIG. 6, one implementation of the stochastic XOR circuit 520 uses a digital XOR gate 820.

Figure 5A:
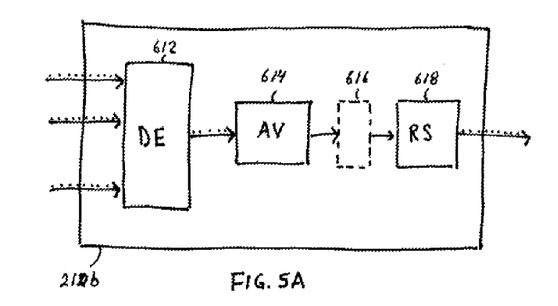
FIGS. 5A-C are stochastic implementations of a Soft Equals node.
Figure 5B:
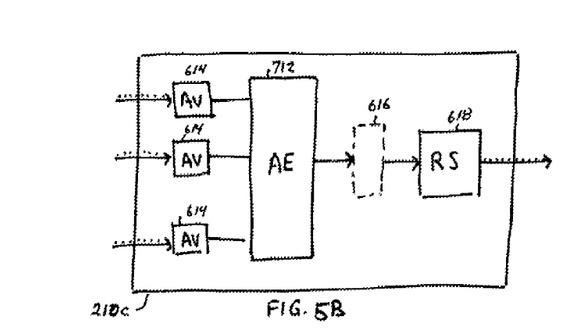
Figure 5C:
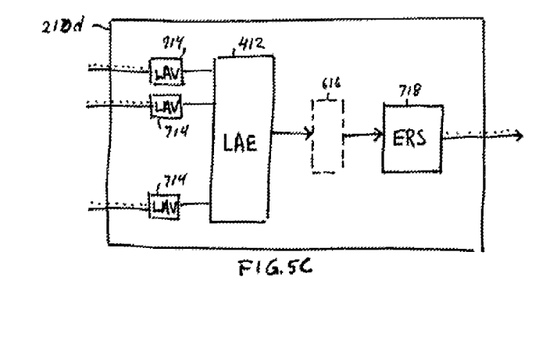

Referring to FIGS. 5A-C, a number of implementations (210b-d) of stochastic domain Soft Equals nodes 210 accept stochastic input and provide stochastic output. Referring to FIG. 5A, a first such stochastic implementation 212b makes use of a stochastic domain Soft Equals (DE) circuit 612 to process the stochastic inputs and provide a stochastic output that represents the value of the Soft Equals function applied to its inputs.

Figure 7:
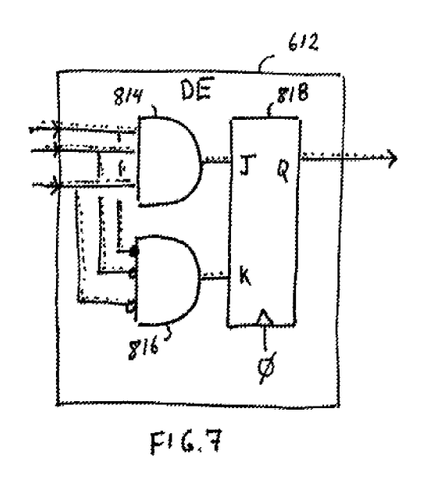
FIG. 7 is a logic circuit implementation of a stochastic Soft Equals node.

Referring to FIG. 7, one implementations of the DE circuit uses a J-K flip flop 818, which is configured to make a transition (or remain at) "1" when clocked with all the inputs are "1" by passing al the inputs an AND gate 814 to the J input of the flip-flop, and configured to make a transition to "0" (or remain at "0") when clocked with all the inputs are "0" by applying an AND to the negations of the inputs in a gate 816 for the K input. There are two characteristics of the output of the DE circuit 612 to consider. First, that rate of transition on the output is significantly slower than on the inputs. Second, stochastic output is correlated with its input, so were the outputs of the DE circuits 612 fed back directly as inputs to the DX circuits 520, those inputs may be correlated, thereby resulting in the DX circuits not properly computing the Soft XOR function as desired.

Continuing to refer to FIG. 5A, to mitigate the effect of the output characteristics of the DE circuit 612, the stochastic output of the DE circuit is passed to an averaging (AV) circuit 614 (also referred to as integrating circuitry or an integrator), which provides an analog output representing its stochastic input. This analog output is then passed to a resampling (RS) circuit 618 (also referred to as re-randomization circuitry), which produces a stochastic output representing its analog input. Therefore, the output of the RS circuit 618 has the same local average statistics as the output of the DE circuit 612, but removes correlation between those signals and generally increases the transition rate of the output. In some implementations, the output of the AV circuit 614 is optionally stored in an analog memory cell 616.

Referring to FIG. 5B, a second stochastic implementation 212c of a Soft Equals node makes use of a linear domain analog Soft Equals (AE) circuit 712, which accepts analog levels corresponding to the message values as input, and provides an analog level corresponding to the message value as output. Each of the stochastic inputs to the overall circuit are passed through corresponding averaging (AV) circuits 614, and the output of the DE circuit 712 is passed through a resampling (RS) circuit 618 to generate the stochastic output, which is passed to the inputs of the stochastic Soft XOR circuits. In some implementations, the output of the AE circuit 712 is stored in an analog memory cell 616 prior to being resampled to form the stochastic output. In other implementations, the analog memory cells (not shown) are used at the inputs of the AE circuit to store the averaged stochastic inputs.

Referring to FIG. 5C, in some implementations, an analog Soft Equal circuit does not necessarily using linear domain level representations. For instance, a log domain analog Soft Equals (LAE) circuit 412, similar to that used in an overall analog implementation, is used with the implementation 210d of the Soft Equals node. The stochastic inputs are passed to log output averaging (LAV) circuits 714, which provide an analog signal level output that is proportional to the log likehood ratio based on the average value of the stochastic input. The output of the LAE circuit 412 is passed through an exponential resampling (ERS) circuit 718, whose stochastic output has an average value that inverts the effect of the LAV circuit. Note that transforming of domain of the analog representation may simplify the circuitry. For instance, use of the log likelihood ratio domain allows the LAE circuit to effectively implement a sum of its input to yield the Soft Equals function.

A number of specific circuit implementations of the averaging (AV) circuit 614, for instance, as used in FIG. 5A, can be used. Some such implementations are described below.

Figures 8, 9:
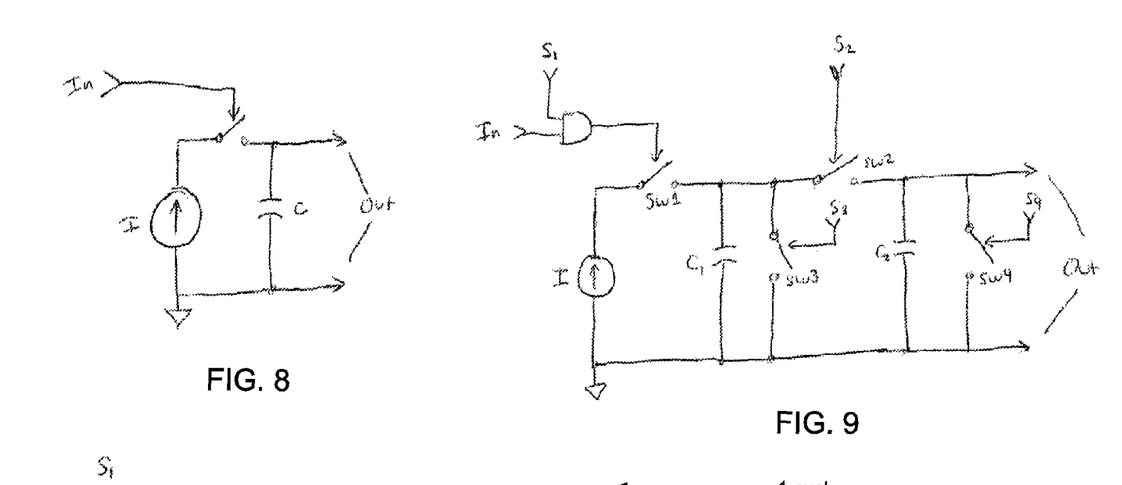
FIG. 8 shows an analog integrator.
FIG. 9 shows an analog probability estimator circuit with periodic updating.

FIG. 8 shows a basic analog integrator that takes a sequence of bits from the input (In). This input controls a switch, which is closed when the input bit is a "1" and open when the input bit is a "0". During the interval in which the input is a "1", the current source (I) deposits a small amount of charge into the capacitor (C). Assuming the capacitor begins with no charge, the amount of charge on the capacitor after N clock cycles is proportional to the fraction of clock cycles for which the input was "1". Since the voltage across the output wires (Out) is proportional to the charge, it is also proportional to the fraction of clock cycles for which the input is "1".

Since the output grows in proportion to the number of cycles, N, to allow this circuit to be used continuously to monitor the bit probability, it is augmented to provide either a periodic probability estimate or a continuously updated probability estimate that maintains a fixed proportion over time. Two different techniques are described.

FIG. 9 shows a circuit that integrates over a series of fixed intervals and provides a new output value at the end of each interval. Each integration interval corresponds to a fixed number of clock cycles. At the end of each interval, a portion of the charge integrated on a first capacitor C1 is transferred to a second capacitor C2, which drives the output. This charge is held constant on the second capacitor until the end of that interval.

Figure 10:
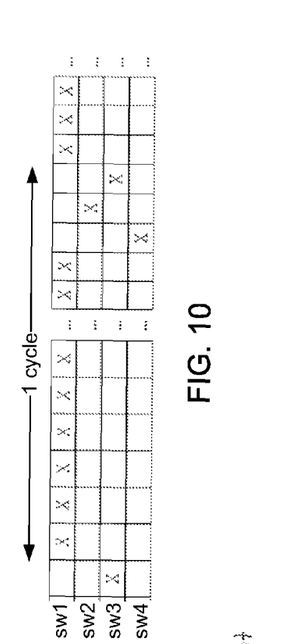
FIG. 10 shows a sequence of switch control signal states.

In addition to the input bit sequence, the circuit shown in FIG. 9 is provided with a series of control signals (S1 through S4) that either directly or indirectly affect the state of a series of switches within the circuit (sw1-sw4). FIG. 10 shows a sequence of states for these switch control signals, where an X in the box indicates switch closure (or in the case of S1, indicates whether S1 is equal to "1", which would result in switch closure only if the input (In) is also equal to "1"). In cases in which one switch closes as another opens appropriate care is taken to avoid both switches being closed at the same time.

Given the sequence of events shown in FIG. 10, (with time proceeding from left to right), the operation is as follows in sequence, starting at the beginning of each interval:

Control signal S1 is set to "0" so that the switch (sw1) connecting the current source to the first capacitor (C1) is forced to be open regardless of the state of the input bit (In).

The shorting switch (sw4) on the second capacitor (C2) is closed, to clear its charge, and then re-opened.

The switch (sw2) connecting the two capacitors is closed, allowing the charge to be shared between the two capacitors, and then re-opened.

The shorting switch (sw3) on the first capacitor (C1) is closed, to clear the charge on this capacitor, and then re-opened.

Control signal S1 is set to 1 so that the switch (sw1) connecting the current source to the first capacitor (C1) will subsequently be controlled by the input bit (In).

This sequence shows one specific case. However, one can achieve the same outcome by changing the order of some of these steps. For example, S4 could close and reopen while S1 is still closed from the previous interval.

During the interval when switch (sw2) connects the two capacitors, since capacitor (C2) had previously been cleared to zero charge, the total charge previously on C1 would be shared between C1 and C2 in proportion to their capacitance. For example, if C1 and C2 are of equal capacitances, the charge on C2 becomes equal to half the charge on C1 before this switch is closed. In this example the value of the output (Out) that represents a given probability is half the voltage that is across C1 at the end of the previous interval given this probability value. Since the output of this circuit feeds a random bit generator, the values of I, C1, and C2 should be chosen so that for a given input bits are all "1", the output voltage is appropriately scaled so that the random bit generator will produce bits with a probability of 1 of being "1". If necessary, additional amplification can be used at the output of this circuit.

The sequence of steps that constitute the transition between intervals need not operate at the clock frequency of the incoming bits. Preferably it operates at a faster rate so that the transition between intervals can be as short as possible, and preferably less than one bit clock cycle. Since the output, which drives the random bit generator, is reset to zero for a short period of time, care should be taken that this interval occurs during a period in which the random bit generator can ignore this momentarily incorrect output.

Figure 11:
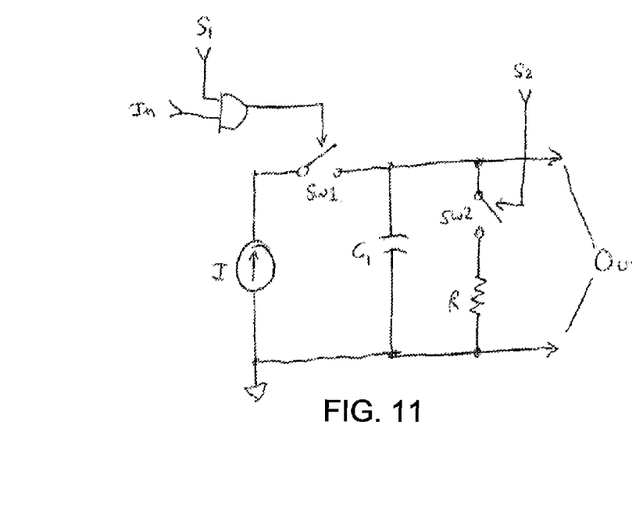
FIG. 11 shows an analog probability estimator circuit with continuous updating.

FIG. 11 shows an alternative circuit in which a leaky form of integration is performed continuously. In this circuit, when switch (sw2) is closed, the charge on the capacitor (C1) drains through a resistive element (R) at a rate proportional to the capacitor's charge.

During each clock period, signal S1 is set to "1" for a sub-interval that allows the input (In) to control the switch (sw1) such that the capacitor charges if the input is a "1". During a second sub-interval, S1 is "0" and S2 is "1", which closes switch (sw2) to allow charge to drain from the capacitor. The specific during of these sub-intervals, the values of I, C1, and R are chosen so that if the inputs (In) were all set to the value "1", the steady state voltage on the capacitor is appropriately scaled so that the random bit generator will produce bits with a probability of 1 of being "1".

This circuit is analogous to a leaky integrator, but with a significantly simplified implementation. For example, this circuit as shown avoids the need for a switch to select between randomly generated bits and bits directly from the input depending on the hold signal. However, this circuit can also be used in conjunction with such a switch.

The circuits described herein add a fixed increment of charge on the capacitor for each one bit, and drains a fixed proportion of the current value of charge on each clock cycle. A slightly simpler circuit variation would remove the switch (sw2) and connect the resistor across the capacitor at all times. Similarly, the control signal S1 and the corresponding AND gate could be removed, leaving the input (In) directly controlling switch (sw1). Since the charging and discharging of the capacitor would occur simultaneously, the behavior would be similar to, but slightly different from the operation of the circuit of FIG. 11.

In both of the probability estimator circuits shown, the current source and switches can be implemented using typical methods, for example using CMOS transistors. In the case of the circuit of FIG. 11, the resistive element (R) can be implemented either using a resistor or an appropriate transistor circuit design to provide an approximately fixed resistance.

Figure 12:
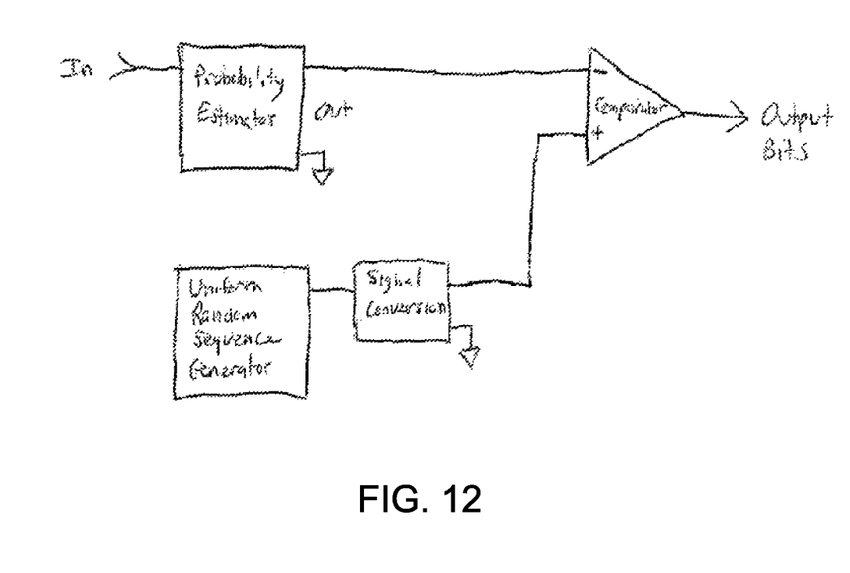
FIG. 12 shows a biased random bit generator drive by a probability estimator.

Various implementation of resampling (RS) circuits 618 may be used for converting between an analog and a stochastic signal representation. Referring to FIG. 12, in one implementation, the input voltage level is used to set the bias probability of a random bit generator. FIG. 12 shows an example circuit that directly accepts the output of the probability estimator to produce a random bit, biased in proportion to the input voltage.

The circuit shown in FIG. 12 makes use of a uniform random sequence generator, which generates a random sequence of analog values that are uniformly distributed over a range of values. An example of such a random sequence generator is that disclosed in K. Eguchi, et al., "Simple Design of a Discrete-Time Chaos Circuit Realizing a Tent Map," *IEICE Trans. Electron.*, Vol. E83-C, No. 5, May 2000, the contents of which are herein incorporated by reference.

In other examples of a resampling circuit, the random signal generator does not necessarily have a uniform level distribution. In such examples, the input level can be passed though a monotonic transformation (e.g., based on the cumulative distribution of the random signal generator) to achieve the same effect as if the random signal generator had a uniform level distribution.

The output of this circuit (with any necessary signal conversion, for example conversion from current to voltage using a resistive element) is connected to one input of an analog comparator. The other input is connected to the output of averaging circuit, for example, as shown in either FIG. 9 or FIG. 11. The polarity and scaling of the inputs should be such that if the output of the probability estimator is at its maximum value, the comparator will (nearly always) produce only 1 outputs, while if the output of the probability estimator is at its minimum value, the comparator will (nearly always) produce only 0 outputs. In this case, output of the comparator will be a random sequence of 0 or 1 values, with a probability approximately the value estimated by the probability estimator, but uncorrelated with the input bit sequence.

It should be understood that the example implementations are only examples, and are not exhaustive, and that aspects of the different implementations may be combined to form yet other embodiments in which signal flows in a circuit implementation for a factor graph use both analog and stochastic signal representations.

It should also be understood that although a number of embodiments are presented using single-ended signals, differential signals may equivalently be used, for example, with averaging being performed separately on each signal line.

Furthermore, either voltage signals or current signals may be used in alternative embodiments In various embodiments presented herein or alternative embodiments, the averaging functions may implement various forms of time averaging. For instance, for an averaging circuit 614 (e.g., as shown in FIG. 5A) which accepts a stochastic signal $x_i(t)$ and forms and analog signal value $\mu_i$, to represent a probability $p_i$. In implementations in which a time period of length T (e.g., in number of clock periods in a computation cycle) is used in which the statistics of the stochastic signal are kept constant, the values $\mu_i$ may be computed as $$\mu_i = \frac{1}{T}\sum_{t=1}^{T} x_i(t).$$

Note that due to further normalization, the values $\mu_i$ may be uniformly scaled (i.e., the same for all i), such that $$\mu_i \propto \frac{1}{T}\sum_{t=1}^{T} x_i(t).$$

In yet other examples, it may be appropriate to apply a monotonic function to the sum, as $$\mu_i = f\left(\frac{1}{T}\sum_{t=1}^{T} x_i(t)\right).$$

In implementations in which the likelihood values may vary over time, various other forms can be used, such as sliding average $$\mu_i(t) = \frac{1}{T}\sum_{t_0=t-T+1}^{t} x_i(t) = \mu_i(t-1) + \frac{x_i(t)}{T} - \frac{x_i(t-T)}{T}$$

or as a decaying average $$\mu_i(t) = \frac{1}{T}x_i(t) + \left(1 - \frac{1}{T}\right)\mu_i(t-1) = \frac{1}{T}\sum_{k=0}\left(1 - \frac{1}{T}\right)^k x_i(t-k).$$

In some examples, the outputs $\mu_i$ are each stored in a memory for example, between iterations or cycles of an iterative decoding operation. In other examples, the vales pass directly to an implementation of a AE circuit 712, which computes $$v=\gamma\pi_i\mu_i \text{ and/or } (1-v)=\gamma\pi_i(1-\mu_i),$$

for a suitable normalizing constant $$\gamma=(\pi_i\mu_i+\pi_i(1-\mu_i))^{-1}$$

which guarantees $v+(1-v)=1$.

In examples in which the likelihoods vary over time and the quantities $\mu_i(t)$ may also be computed over time, then the output value $v(t)$ may also be computed over time, or at periodic intervals.

Although the description above focuses on binary signals in which the variables may take on values 0 and 1, in other embodiments the approach is extended to M-ary variables. For example, M−1 integrators may be used to form values $\mu_i^{(m)}$ for m=1, . . . , M. The output of the logic gate can then compute the appropriate values of $v^{(m)}$ according to which the output signal y(t) is resampled.

In yet other embodiments, the approach is extended to multiple bit representations of variable. For example, bit X(t) and Y(t) are sequence of n-bit numbers sampled from a unimodal distribution, such as a Gaussian distribution, the approach described above is applied bit-wise. Therefore, for an n-bit representation $X(t)=(x_{n-1}(t), \ldots, x_1(t), x_0(t))$, and the n-bit representation of Y(t) defined similarly, each pair of inputs $x_i(t)$ and $y_i(t)$ is passed through a circuit as shown in FIG. 1 to output through the integration and resampling process a corresponding bit output sequence $z_i(t)$. The output bits are then used to form the sampling of the n-bit output sequence $Z(t)=(z_{n-1}(t), \ldots, z_0(t))$.

It should be understood that embodiments in which a Soft XOR function is performed on stochastic signals are only examples. Other factors (e.g., constraints) may be implemented in a belief propagation implementation of a factor graph such that the circuit implementation of those factors make use of input and/or output stochastic signals.

In some implementations, one or more approaches to resampling and/or averaging are extended to introduce selected delays in the signal path, as a means of further mitigating potential correlation between the signals. The selection of such delays is described in copending application 61/306,880, titled "SELECTIVE DELAY OF DATA RECEIPT IN STOCHASTIC COMPUTATION". In some implementation, a delay circuit is included on each of at least some of said signal paths links. Each delay module is configured or configurable to delay a signal represented as a time pattern traversing said signal path by an assigned delay. In some examples, the delay circuit is combined with a circuit component for converting between a signal level and a time pattern representation of a signals value on the signal path.

Implementations of the approached described above may be implemented in circuitry, for example, integrated into a single integrated circuit. Such an integrated circuit may include other modules, such as a memory array, and the circuitry described above may be used to correct data errors in the memory array. The circuitry described above may be represented in functional information embodied in tangible data (e.g., on a computer storage medium) used to drive an automated (e.g., computer implemented) circuit layout or other circuit design or fabrication process. For example, modules described above may be tangibly embodied on computer readable media for providing driving the function of the automated processes. An example of such an embodiment may conform to a hardware description language specification language, such as Verilog. In some implementations, a combination of special-purpose circuitry and general purpose digital processing (e.g., using a processor) may be used to implement the approaches described above.

It is to be understood that the foregoing description is intended to illustrate and not to limit the scope of the invention, which is defined by the scope of the appended claims. Other embodiments are within the scope of the following claims.

What is claimed is:

1. A processor for implementing a network of functional nodes and communication paths between the nodes, the processor comprising:
a plurality of circuit implementations of the functional nodes of the processor; and
a plurality of signal paths implementing the communication paths linking the circuit implementations of the nodes, wherein at least some of the signal paths are configured to pass signal values represented on said paths according to corresponding temporal patterns;
wherein at least some of the circuit implementations of the functional nodes each includes circuitry for combining temporal patterns of a plurality of signals to form a temporal pattern of a combined signal; and
wherein the processor comprises a plurality of circuit components each for conversion between a signal value represented as a signal level and a signal value represented as a temporal pattern;
wherein at least some of the circuit implementations of the functional nodes each includes circuitry for combining signal levels of a plurality of signals to form a signal level on a combined signal; and
wherein the functional nodes that include circuitry for combining signal levels further include at least some of the circuit components for conversion between a signal value represented as a signal level and a signal value represented as a temporal pattern, said circuit component for conversion being coupled to the circuitry for combining the signal levels.

2. The processor of claim 1 wherein the signal values represented as signal levels are represented as voltage or current levels.

3. The processor of claim 1 wherein the signal values represented as temporal patterns are represented by a time averages of varying signal levels.

4. The processor of claim 1 wherein the processor implements a belief propagation algorithm.

5. The processor of claim 3 wherein the processor implements a Sum-Product algorithm.

6. The processor of claim 1 wherein the network represents a factor graph.

7. The processor of claim 1 wherein the plurality of circuit implementations of the functional nodes a plurality of circuit implementations of variable nodes and a plurality of circuit implementations of factor nodes.

8. The processor of claim 7 wherein the processor is configured to perform a decoding operation, and wherein the variable nodes correspond to inputs to the decoding, and the factor nodes correspond to constraints on the inputs.

9. The processor of claim 1 wherein the plurality of circuit implementations of function nodes include a plurality implementations of Soft XOR nodes, each of the implementations of a Soft XOR node comprising a logical XOR gate configured to accept a plurality of signals with values represented as temporal patterns, and to produce a signal with a temporal pattern as the output of the logical XOR gate.

10. The processor of claim 1 wherein the plurality of circuit implementations of function nodes include a plurality implementations of Soft Equals nodes.

11. The processor of claim 10 wherein each of the implementation of a Soft Equals node comprising:
logic circuitry configured to accept a plurality of signals with values represented as temporal patterns, and to produce a signal with a temporal pattern as the output of the logic circuitry;
a first circuit component of the plurality of circuit components for conversion between a signal value represented as a signal level and a signal value represented as a temporal pattern, said circuit component coupled to the output of the logic circuitry and forming a first signal with a value represented as a signal level; and a second circuit component of said plurality of circuit components for conversion of the first signal to form a second signal with a value represented as a temporal pattern.

12. The processor of claim 11 wherein the logic circuitry comprises a flip-flop.

13. The processor of claim 11 wherein each of the implementation of a Soft Equals node comprising:
one circuit component of the plurality of circuit components for conversion between a signal value represented as a signal level and a signal value represented as a temporal pattern circuitry coupled to each input for converting a signal value represented as a temporal pattern to a signal value represented as a signal level;
functional circuitry for combining the signal levels output from the circuit components; and
a further circuit component of the plurality of circuit components for conversion between a signal value represented as a signal level and a signal value represented as a temporal pattern circuitry coupled to the output of the functional circuitry for converting from a signal value represented as a signal level to a signal value represented as a temporal pattern.

14. The processor of claim 1 further comprising a plurality of storage cells, each storage cell for writing and for reading a signal level.

15. A processor for implementing a network of functional nodes and communication paths between the nodes, the processor comprising:
a plurality of circuit implementations of the functional nodes of the processor; and
a plurality of signal paths implementing the communication paths linking the circuit implementations of the nodes, wherein at least some of the signal paths are configured to pass signal values represented according to corresponding temporal patterns on the signal paths;
wherein at least some of the circuit implementations of the functional nodes each includes circuitry for combining temporal patterns of a plurality of signals to form a temporal pattern of a combined signal; and
wherein the processor comprises a plurality of circuit components each for conversion between a signal value represented as a signal level and a signal value represented as a temporal pattern; and
wherein the plurality of circuit components each for conversion between a signal value represented as a signal level and a signal value represented as a temporal pattern includes components each for conversion from a signal level to a random temporal pattern.

16. The processor of claim 15 wherein at least some of the circuit implementations of the functional nodes include circuitry for combining signal levels of a plurality of signals to form a signal level on a combined signal.

17. The processor of claim 16 wherein the functional nodes that include circuitry for combining signal levels further include at least some of the circuit components for conversion between a signal value represented as a signal level and a signal value represented as a temporal pattern, said circuit component for conversion being coupled to the circuitry for combining the signal levels.

18. The processor of claim 15 wherein the random temporal pattern comprises a temporal pattern of transitions between a set of signal levels, and wherein the signal value is represented using a fraction of time at one or more levels of the set of signal levels.

19. The processor of claim 18 wherein the random temporal pattern comprises a temporal pattern of transitions between two signal levels and the signal value is represented using a fraction of time at one of the signal levels.

20. The processor of claim 19 wherein the signal value is represented as a monotonic function of the fraction of time at one of the levels.

21. The processor of claim 20 wherein the signal value is represented as a linear function of the fraction of time at one of the levels.

22. The processor of claim 20 wherein the signal value is represented as a compressive function of the fraction of time at one of the levels.

23. The processor of claim 15 wherein at least one component for conversion from a signal level to a random temporal pattern includes
a random signal generator with output signal statistics independent of the signal level; and
a circuit for combining the signal level and an output of the random signal generator to form the random temporal pattern according to the signal level.

24. The processor of claim 23 wherein the circuitry for combining the random signal and the signal level comprises a comparator to compare the signal level and a time-varying level of the random signal.

25. The processor of claim 24 wherein the random signal generator has a uniform output level distribution.

26. The processor of claim 15 wherein the plurality of circuit components for conversion between a signal value represented as a signal level and a signal value represented as a temporal pattern include components for conversion from a temporal pattern to a signal level.

27. The processor of claim 26 wherein at least one component for conversion from a temporal pattern to a signal level includes an averaging circuit for accepting the signal with the temporal pattern and being responsive to a fraction of time the signal with the temporal pattern has a first signal level of a set of signal levels uses to form the temporal pattern.

28. The processor of claim 27 wherein the averaging circuit comprises a fixed interval averaging circuit that is responsive to a fraction of time within the fixed interval that the signal has the first signal level.

29. The processor of claim 27 wherein the averaging circuit comprises at least one of a decaying averaging circuit and a moving average circuit that is responsive to the fraction of time the signal has the first signal level.

30. The processor of claim 27 wherein the signal level is a monotonic function of the fraction of time the signal with the random pattern has the first signal level.

31. The processor of claim 30 wherein the signal value is a linear function of the fraction of time at the first level.

32. The processor of claim 30 wherein the signal value is a compressive function of the fraction of time at the first level.

33. A processor for implementing a network of functional nodes and communication paths between the nodes, the processor comprising:
a plurality of circuit implementations of the functional nodes of the processor;
a plurality of signal paths implementing the communication paths linking the circuit implementations of the nodes, wherein at least some of the signal paths are configured to pass a signal value represented according to a temporal pattern on the signal paths; and
a plurality of storage cells, each storage cell for writing and for reading a signal level;
wherein at least some of the circuit implementations of the functional nodes include circuitry for combining temporal patterns of a plurality of signals to form a temporal pattern of a combined signal;

wherein the processor comprises a plurality of circuit components for conversion between a signal value represented as a signal level and a signal value represented as a temporal pattern; and wherein each storage cell is coupled or couplable to a circuit component of the plurality of circuit components for conversion between a signal value represented as a signal level and a signal value represented as a temporal pattern circuitry for at least one of receiving a value represented as a temporal pattern and providing a value represented as a temporal pattern.

34. The processor of claim 33 further comprising a delay circuit on each of at least some of said signal paths links, each delay module being configured or configurable to delay a signal represented as a time pattern traversing said signal path by an assigned delay.

* * * * *